(12) United States Patent
Redecker

(10) Patent No.: US 6,872,969 B2
(45) Date of Patent: Mar. 29, 2005

(54) NON-VOLATILE MEMORY DEVICE AND MATRIX DISPLAY PANEL USING THE SAME

(75) Inventor: Michael Redecker, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/338,828

(22) Filed: Jan. 9, 2003

(65) Prior Publication Data
US 2003/0127676 A1 Jul. 10, 2003

(30) Foreign Application Priority Data
Jan. 9, 2002 (DE) .......................... 102 00 475

(51) Int. Cl.[7] .................... H01L 35/24; H01L 51/00; H01L 29/76; H01L 29/94; H01L 31/062
(52) U.S. Cl. ................................. 257/40; 257/295
(58) Field of Search ................. 257/40, 295

(56) References Cited

U.S. PATENT DOCUMENTS

| | | | | |
|---|---|---|---|---|
| 4,860,254 A | | 8/1989 | Pott et al. | 365/145 |
| 5,471,417 A | | 11/1995 | Krautschneider et al. | 365/145 |
| 5,981,970 A | * | 11/1999 | Dimitrakopoulos et al. | 257/40 |
| 6,055,180 A | * | 4/2000 | Gudesen et al. | 365/175 |
| 6,067,244 A | * | 5/2000 | Ma et al. | 365/145 |
| 6,326,640 B1 | * | 12/2001 | Shi et al. | 257/40 |
| 6,532,165 B1 | * | 3/2003 | Katori | 365/145 |
| 6,621,098 B1 | * | 9/2003 | Jackson et al. | 257/40 |

FOREIGN PATENT DOCUMENTS

WO    WO 98/14989    4/1998    ....... H01L/21/3205

OTHER PUBLICATIONS

C.J. Drury et al., Applied Physics Letters, vol. 73 (1998), p. 198 ff.

Japanese Journal of Applied Physics, vol. 4 (1986), p. 60 ff. (polymer ferroelectric materials), by Yamauchi et al.

* cited by examiner

Primary Examiner—Howard Weiss
(74) Attorney, Agent, or Firm—McGuireWoods LLP

(57) ABSTRACT

A non-volatile memory device and a matrix display panel using the memory device are provided. The non-volatile memory device includes a source, a drain, an active layer, a gate insulating layer, and a gate. The active layer is formed of an organic semiconductor in a contact region between the source and the drain. The gate-insulating layer is formed of a ferroelectric material on the active layer, and the gate is formed on the gate-insulating layer. Accordingly, the non-volatile memory device and the matrix display panel are very flexible, lightweight multi-programmable and can be easily manufactured.

12 Claims, 3 Drawing Sheets

NON-VOLATILE MEMORY DEVICE AND MATRIX DISPLAY PANEL USING THE SAME

BACKGROUND OF THE INVENTION

1. Field of the Invention

The present invention relates to a non-volatile memory device and a matrix display panel using the memory device, and more particularly, to a non-volatile active memory device capable of retaining and keeping information in a state variable by a corresponding pulsed voltage after suspension of supplying a voltage and a matrix display panel using the same

2. Description of the Related Art

Memory devices manufactured using silicon and inorganic semiconductor technologies are considered to provide the most important function second only to a microprocessor in every computer system.

Memory devices are classified into non-volatile memory devices and volatile memory devices. Examples of non-volatile memory devices include read only memory (ROM), programmable read only memory (PROM), erasable programmable read only memory (EPROM), and electrically erasable programmable read only memory (EEPROM). The non-volatile memory devices store essential information for booting, configuration, and identification of a system. An example of volatile memory devices include random access memory (RAM).

Recently, a high-level ferroelectric random access memory (FRAM) whose functionality is comparable to an EEPROM, but which has a reduced writing time, has been developed. In the manufacture of the FRAM, an inorganic ferroelectric material is combined with silicon semiconductor technology.

It is widely known that organic semiconductors are applied when simple electronic circuits are integrated into a flexible substrate. In this case, polymer-based electronic identification devices are addressable by means of a high-frequency electric field, and a pre-programmed identification code can be sent back.

In the applications of the organic semiconductors, it is commonly necessary to store reference information for coding/identification in a flexible circuit. A non-volatile memory device is an essential element for reducing the weight of a circuit because it does not need a battery to constantly provide an operating voltage to the circuit. In connection with this, radio frequency transponders have been introduced (C. J. Drury et al, Applied Physics Letters, Vol. 73 (1998), p. 198 ff).

A non-volatile memory in the radio frequency transducer is made conductive by piercing the surface with a needle to form mechanically programmable contacts. Here, a very simple programming technique is used, but cannot be applied to mass production. In addition, no further new code canbe allocated to the transponder after non-recurrent programming. As described above, non-volatile memory devices will be commonly referred to as "ROM"s.

Ferroelectric material-based rewritable memory devices were disclosed in patents WO 98/14.989 and U.S. Pat. No. 4,860,254. The disclosed ferroroelectric capacitors are passive devices where information stored therein is variable by polarization.

Silicon technology-based active memory devices were disclosed in U.S. Pat. No. 5,471,417, in which inorganic ferroroelectric materials are used, and *Journal of Applied Physics,* Vol. 4 (1986), p. 60 ff. (polymer ferroelectric materials), by Yamauchi et al.

SUMMARY OF THE INVENTION

It is an object of the present invention to provide a lightweight, highly flexible, easy-to-manufacture, and multi-programmable non-volatile memory device and a matrix display panel using the memory device.

In one aspect, the present invention provides a non-volatile, field effect transistor memory device comprising a source, a drain, an active layer, a gate insulating layer, and a gate. The active layer is formed of an organic semiconductor between the source and the drain. The gate insulating layer is formed of a ferroelectric material on the active layer, and the gate is formed on the gate insulating layer.

Since the non-volatile memory device according to the present invention includes the ferroelectric gate insulating layer and the organic semiconductor active layer, it is very flexible, light-weight, multi-programmable and can be easily manufactured.

In another aspect, the present invention provides an electrically addressable matrix display panel in which a plurality of non-volatile memory devices are connected to row lines and column lines together with display devices, wherein each of the non-volatile memory devices is the field effect transistor described above, which comprises a source, a drain, an organic semiconductor active layer, a ferroelectric gate insulating layer, and a gate.

The present invention also provide an optically writeable matrix display panel in which a plurality of non-volatile memory devices are connected to row lines and column lines together with display devices each of which acts as a display and an optical sensor, wherein each of the non-volatile memory devices is the field effect transistor described above, which comprises: a source, a drain, an organic semiconductor active layer, a ferroelectric gate insulating layer, and a gate.

BRIEF DESCRIPTION OF THE DRAWINGS

The above object and advantages of the present invention will become more apparent by describing in detail preferred embodiments thereof with reference to the attached drawings.

DETAILED DESCRIPTION OF THE INVENTION

In the following embodiments of the present invention, a non-volatile memory device and a matrix display panel using the memory device fundamentally share the principles of a ferroelectric random access memory (FRAM). In particular, in the FRAM, a ferroelectric material is polarized with the application of an electric field, and the polarization remains after suspension of the applied electric field. When the electric field is applied in an opposite direction, the state of the polarization is inverted.

Figure 1:
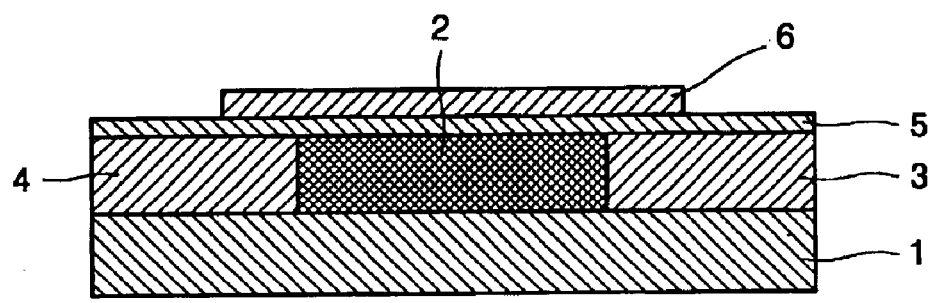
FIG. 1 shows the structure of a non-volatile memory device and its circuit diagram according to an embodiment of the present invention.
Figure 1:
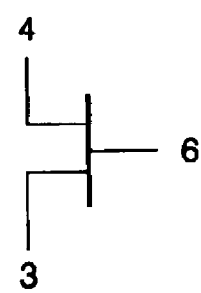

Referring to FIG. 1, a non-volatile memory device according to the present invention includes a substrate 1 and a field effect transistor. The field effect transistor includes a gate 6, a dielectric layer 5, a source 4, a drain 3, and an organic semiconductor active layer 2. The dielectric layer 5 of the field effect transistor is a ferroelectric gate-insulating layer. Conductivity of the organic semiconductor active layer 2, which forms a source-drain channel, is controlled by a charge-carrier concentration and, subsequently, indirectly by a potential at the boundary of the gate insulating layer 5 and the organic semiconductor active layer 2. The boundary potential is determined by a set voltage of the gate 6 and a polarizing voltage of the gate insulating layer 5.

The polarization state of the ferroelectric gate-insulating layer 5 is chargeable when a voltage between the gate 6 and the source 4 or the drain 3 exceeds a predetermined level.

Figure 2:
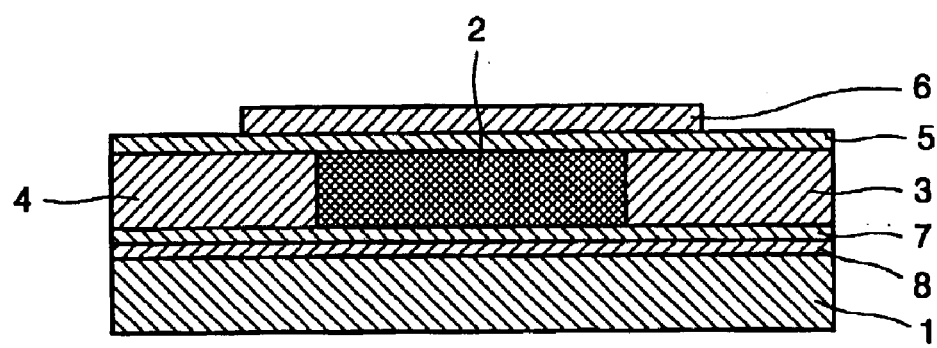
FIG. 2 shows an alternative embodiment of the non-volatile memory device and its circuit diagram of FIG. 1.
Figure 2:
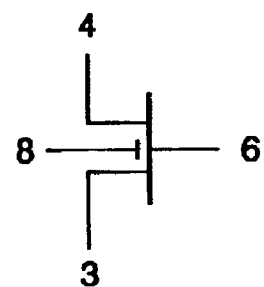

Alternatively, the non-volatile memory device according to the present invention further includes an auxiliary gate 8, as shown in FIG. 2. In the non-volatile memory device of FIG. 2, a programming voltage is applied between the gate 6 and the auxiliary gate 8. In FIG. 2, the same reference numerals as those in FIG. 1 denote the same elements In FIG. 1, a circuit diagram below the sectional view of the non-volatile memory device shows the electronic function of the essential structural elements of the non-volatile memory device. The operating condition of the transistor can be changed and can be permanently stored by a program.

Figure 3A:
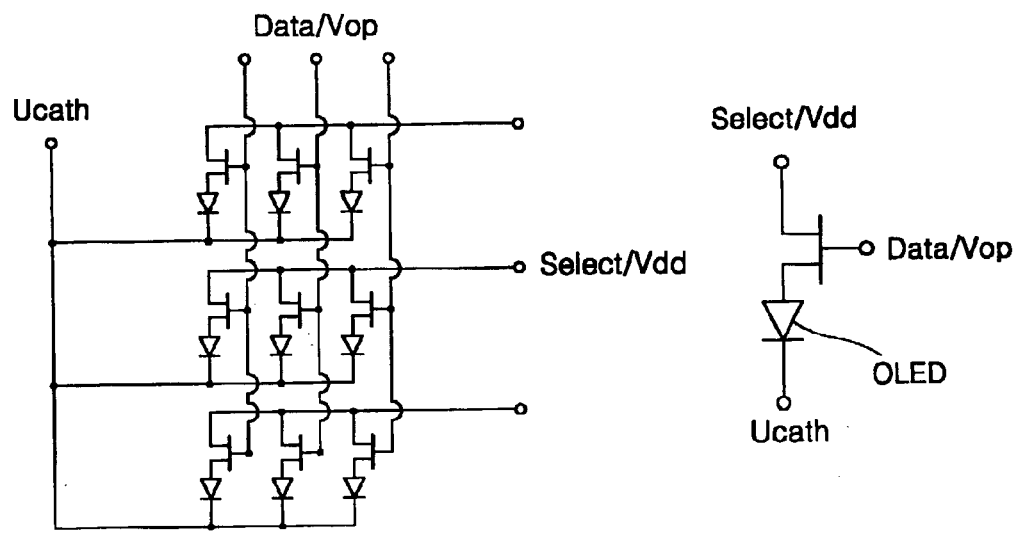
FIGS. 3A and 3B show electrically addressable 3×3 matrix display panels according to an embodiment of the present invention, in which non-volatile memory devices are connected to organic light-emitting diodes (LEDs).
Figure 3B:
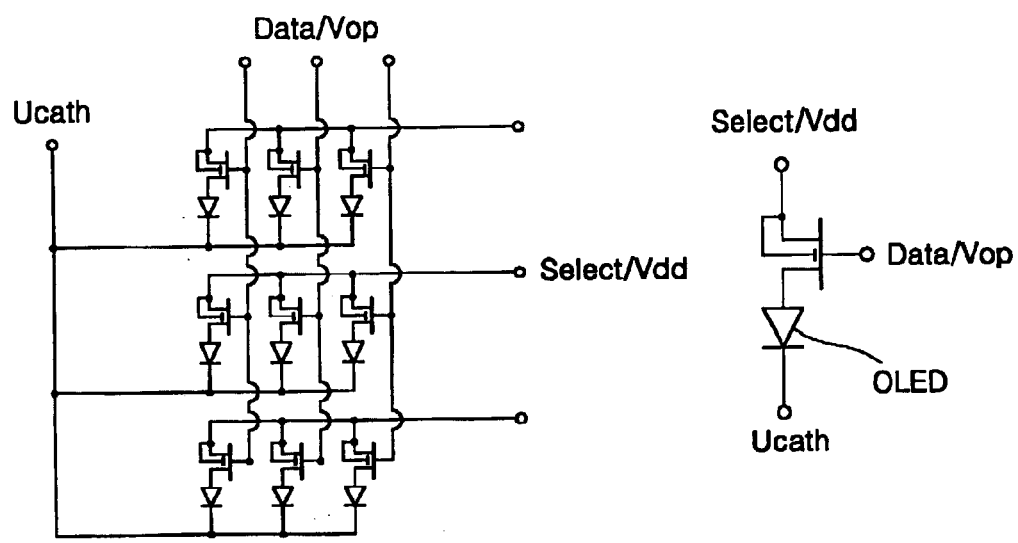
Figure 4A:
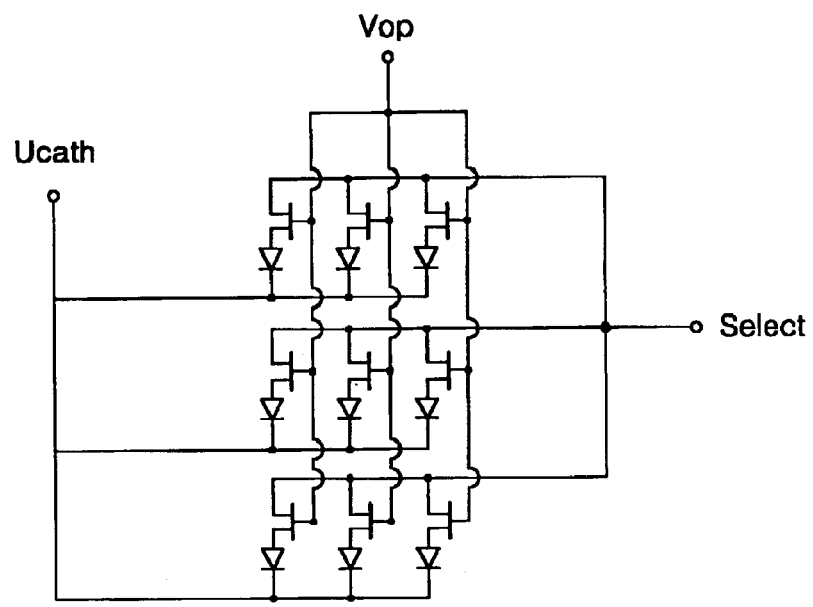
FIGS. 4A and 4B show optically writeable 3×3 matrix display panels according to another embodiment of the present invention.
Figure 4B:
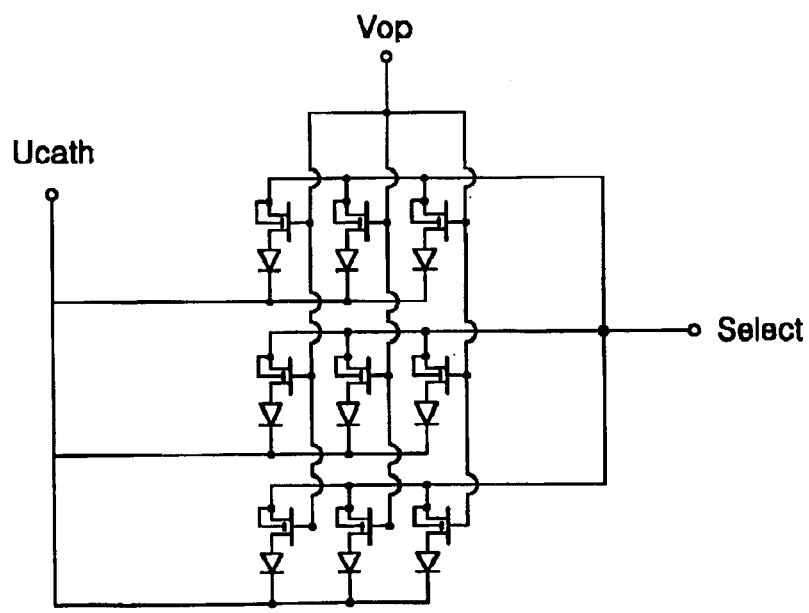

FIGS. 3A through 4B show major types of matrix display panels according to embodiments of the present invention. Referring to FIGS. 3A and 3B, electrically addressable memory devices are connected with appropriate display devices. Referring to FIGS. 4A and 4B, a display device acts as an optical sensor to optically read and permanently store picture information. The picture information can be displayed again by means of a controller for memory devices.

Hereinafter, the non-volatile memory device and the matrix display panel using the memory device according to the present invention will be described in detail.

In the non-volatile memory devices shown in FIGS. 1 and 2, the organic semiconductor active layer 2 is formed by a standard thin layer isolation method. The standard thin layer isolation method includes vacuum evaporation, plasma-enhanced layer isolation, spin coating, ink jet printing, silk screen printing (serigraphy) and other related coating processes. In addition, auxiliary inorganic layers can be formed by vacuum deposition, sputtering, or plasma-enhanced layer isolation.

The non-volatile memory device having the structure of FIG. 1 is implemented through the following processes. The substrate 1 provides a preliminary structure for contact between the source 4 and the drain 3. The source 4 and the drain 3 are formed by photolithography using a varnish mask and subsequent etching of a metal layer. Suitable contact materials include gold, platinum, palladium, and indium tin oxide (ITO). Alternatively, a conductive polymer, for example, polyethylene dihydroxythiophene, can be applied by ink jet printing.

Next, a precursor solution for the organic semiconductor active layer 2 is spin-coated or deposited in a high vacuum condition. Suitable organic semiconductor precursors for the spin coating include polythiophene and pentacene precursor materials. Suitable materials for the high-vacuum evaporation include pentacene, low molecular weight oligothiophenes, perylene imide, and naphthalene dicarboxylic acid diimide.

As shown in FIG. 2, an auxiliary insulating thin layer 7 may be additionally deposited in a high vacuum condition. Suitable materials for the auxiliary insulating thin layer 7 include polyxylylene and silicon monoxide.

Next, as a precursor solution for the ferroelectric gate insulating layer 5 is spin-coated. Suitable materials for the ferroelectric gate-insulating layer 5 include polyvinulidene fluoride and vinylidene fluoride-trifluor ethylene copolymers.

Alternatively, additional auxiliary insulating layers may be formed on and underneath the ferroelectric gate-insulating layer 5 in a high vacuum condition. In other words, the auxiliary insulating layers are formed on the organic semiconductor active layer 2 and the ferroelectric gate-insulating layer 5.

Next, the gate 6 is deposited of a metal, for example, aluminium, neodymium, silver, gold, nickel, palladium, and copper. Alternatively, a conductive polymer of, for example, polyethylene dihydroxythiophene, can be applied.

An electrically addressable matrix display panel according to the present invention consists of the memory devices as described with reference to FIGS. 1 and 2. The electrically addressable matrix display panel having a memory function is implemented by connecting a plurality of memory devices with display pixels, as shown in FIG. 3. The display devices (pixels) are preferentially based on an organic light-emitting diode (OLED). Liquid crystal display technology and electrochromatic and electrophoretic display mechanisms can be applied to the manufacture of the electrically addressable matrix display panel.

Referring to FIGS. 3A and 3B, data signals are applied to column lines Data/Vop of the matrix, and select signals are applied to row lines Select/Vdd of the matrix. An applied voltage level is determined by hole-conductive organic semiconductor-based structural elements.

Cyclic writing operation of the matrix display panels of FIGS. 3A and 3B will be described as follows. For the programming of a pixel, it is necessary to apply an appropriate voltage between data line Data/Vop and select line Select/Vdd while a frame potential is applied to cathode lines Ucath. For example, when a positive voltage is applied to only one data line, and a negative voltage is applied to only one select line, the voltage difference occurs only in one memory device of the matrix. By addressing corresponding data and select lines, picture information can be written to the matrix and permanently stored therein.

Cyclic reading operation of the matrix display panels of FIGS. 3A and 3B will be described as follows. To display a written image on the matrix display panel, a frame potential is applied to all select lines Select/Vdd. An appropriate negative potential is applied to all data lines Data/Vop to selectively operate corresponding transistors according to the program, and an appropriate negative potential is applied to all cathode lines Ucath. Accordingly, the pixels are selectively activated or inactivated to display the stored image.

Optically writeable matrix display panels according to the present invention are constructed, as shown in FIGS. 4A and 4B, in a similar way to the electrically addressable matrix display panels of FIGS. 3A and 3B. In the optically writeable matrix display panel of FIG. 4, it is unnecessary to select arbitrary row/column lines. In the embodiment, all row lines Vop and all select lines Select are commonly connected. The display devices act as an optical sensor as well as a display. The display devices are preferentially based on an OLED. When the OLED is inversely operated, it functions as a photo diode for the optical sensor. The function of the photo diode is applied to writing cycle.

Cyclic writing operation of the matrix display panels of FIGS. 4A and 4B will be described as follows. When the hole-conductive semiconductor is used as described above, a negative potential is applied to all row lines Vop and all column lines Select, and a frame potential is applied to all cathode lines Ucath. The negative voltage applied to all column lines Select is determined by the photocurrent of the LEDs. When light of an appropriate wavelength enters the LEDs, the drain voltage rises to be positive, thereby enabling programming of the memory transistors. To erase the program, opposite potentials are applied to the gate and the drain. To this end, a frame potential is applied to all cathode lines Ucath and all column lines Select, and a positive potential is applied to all row lines Vop. In this operation, light is not involved.

Cyclic reading operation of the matrix display panels of FIGS. 4A and 4B will be described as follows. In the reading cycle, a positive potential is applied to all column lines Select, and a frame potential is applied to all row lines Vop and all cathode lines Ucath. Each of the transistors is activated (conducted) and inactivated according to their program. The LEDs are operated forward and emit light when the transistors are conducted. As a result, the stored image information is displayed as a bright picture.

As described above, the non-volatile memory device according to the present invention include the organic semiconductor active layer in an active region of the memory circuit, and thus the non-volatile memory device and the matrix display panel using the same memory device according to the presents invention is very flexible, light-weight, and multi-programmable and can be easily manufactured.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An electrically addressable matrix display panel, comprising:
    a plurality of non-volatile memory devices connected to row lines and column lines together with display devises, wherein each of the non-volatile memory devices is a field effect transistor further comprised of,
    a source;
    a drain;
    an organic semiconductor active layer formed between the source and the drain;
    a ferroelectric gate-insulating layer formed on the organic semiconductor active layer; and
    a gate formed on the ferroelectric gate-insulating layer.

2. The electrically addressable matrix display panel of claim 1, wherein each of the display devices includes an organic light-emitting diode.

3. The electrically addressable matrix display panel of claim 1, wherein the ferroelectric gate-insulating layer is formed of a polymer-containing organic material.

4. The electrically addressable matrix display panel of claim 1, wherein each of the non-volatile memory devices further comprises an auxiliary insulating layer on the organic semiconductor active layer.

5. The electrically addressable matrix display panel of claim 1, wherein each of the non-volatile memory devices further comprises an auxiliary insulating layer on the ferroelectric gate-insulating layer.

6. The electrically addressable matrix display panel of claim 1, wherein each of the non-volatile memory device further comprises:
    an auxiliary gate on a substrate; and
    an auxiliary insulating layer on the auxiliary gate and underneath the organic semiconductor active layer, the source, and the drain.

7. An optically writeable matrix display panel, comprising:
    a plurality of non-volatile memory devices are connected to row lines and column lines together with display devices wherein each display device and an optical sensor, wherein each of the non-volatile memory devices is a field effect transistor further comprised of,
    a source;
    a drain;
    an organic semiconductor active layer formed between the source and the drain;
    a ferroelectric gate-insulating layer formed on the organic semiconductor active layer; and
    a gate formed on the ferroelectric gate insulating layer.

8. The optically writeable matrix display panel of claim 7, wherein each of the display devices includes an organic light-emitting diode.

9. The optically writeable matrix display panel of claim 7, wherein the ferroelectric gate insulating layer is formed of a polymer-containing organic material.

10. The optically writeable matrix display panel of claim 7, wherein each of the non-volatile memory devices further comprises an auxiliary insulating layer on the organic semiconductor active layer.

11. The optically writeable matrix display panel of claim 7, wherein each of the non-volatile memory devices further comprises an auxiliary insulating layer on the ferroelectric gate insulating layer.

12. The optically writeable matrix display panel of claim 7, wherein each of the non-volatile memory device further comprises:
    an auxiliary gate on a substrate; and
    an auxiliary insulating layer on the auxiliary gate and underneath the organic semiconductor active layer, the source, and the drain.

* * * * *